United States Patent
Hoogzaad (10) Patent No.: US 8,536,945 B2
(45) Date of Patent: Sep. 17, 2013

(54) DIFFERENTIAL OUTPUT STAGE

(75) Inventor: Gian Hoogzaad, Mook (NL)

(73) Assignee: NXP B.V., Eindhoven (NL)

(*) Notice: Subject to any disclaimer, the term of this patent is extended or adjusted under 35 U.S.C. 154(b) by 58 days.

(21) Appl. No.: 13/431,588

(22) Filed: Mar. 27, 2012

(65) Prior Publication Data

US 2012/0262235 A1     Oct. 18, 2012

(30) Foreign Application Priority Data

Apr. 12, 2011   (EP) .................................... 11161976

(51) Int. Cl.
*H03F 3/45*     (2006.01)

(52) U.S. Cl.
USPC .......................................... 330/252; 330/254

(58) Field of Classification Search
USPC ................................... 330/252, 69, 254, 261
See application file for complete search history.

(56) References Cited

U.S. PATENT DOCUMENTS

| | | | |
|---|---|---|---|
| 6,100,759 A * | 8/2000 | Sirna et al. ..................... | 330/252 |
| 8,258,867 B2 * | 9/2012 | Zhang ............................ | 330/252 |
| 8,354,887 B1 * | 1/2013 | Zhou et al. ..................... | 330/292 |
| 2008/0036537 A1 | 2/2008 | Syed | |

OTHER PUBLICATIONS

Holdenried, C. D. et al. "Analysis and Design of HBT Cherry-Hooper Amplifiers With Emitter-Follower Feedback for Optical Communications", IEEE Journal of Solid-State Circuits, vol. 39, No. 11, pp. 1959-1967 (Nov. 2004).

Kim, J. K. et al. "High-Speed, Current-Mode Logic Amplifier Using Positive Feedback and Feed-Forward Source-Follower Techniques for High-Speed CMOS I/o Buffer", IEEE Journal of Solid-State Circuits, vol. 40, No. 3, pp. 796-802 (Mar. 2005).

Tran, H. et al. "6-kΩ, 43-Gb/s Differential Transimpedance-Limiting Amplifier with Auto-Zero Feedback and High Dynamic Range", IEEE Journal of Solid-State Circuits, vol. 39, No. 10, pp. 1680-1689 (Oct. 2004).

Extended European Search Report for EP Patent Appln. No. 11161976.3 (Oct. 24, 2011).

* cited by examiner

*Primary Examiner* — Henry Choe (57) ABSTRACT

A differential output stage configured for receiving differential input signal comprising first and second signals, comprising a first output for providing a first output signal, and a second output providing a second output signal, the first and second output signals together forming a differential output signal, a first voltage buffer and first controlled current source each connected to the first output, the first voltage buffer being driven by a signal in-phase with the first input signal, the first controlled current source being driven by a signal in-phase with the second input signal, and a second voltage buffer and second controlled current source each connected to the second output, the second voltage buffer being driven by a signal in-phase with the second input signal, the second controlled current source being driven a signal in-phase with by the first input signal.

16 Claims, 5 Drawing Sheets

DIFFERENTIAL OUTPUT STAGE

CROSS-REFERENCE TO RELATED APPLICATIONS

This application claims the priority under 35 U.S.C. §119 of European patent application no. 11161976.3, filed on Apr. 12, 2011, the contents of which are incorporated by reference herein.

FIELD OF THE INVENTION

The invention relates to a differential output stage.

BACKGROUND OF THE INVENTION

Differential amplifiers are used in a variety of applications, for example, in satellite receivers.

Satellites transmit either in the Ku or Ka band. The Ku band ranges from 12.2~12.7 GHz, the Ka band from 18.3~18.8 and 19.7~20.2 GHz. The satellite dish receiver electronics consists first of a Low Noise Amplifier (LNA) followed by a Low Noise Block (LNB). The LNB comprises a mixer, filter and amplifier (also known as gainblock). The mixer of the LNB delivers the signal at an Intermediate Frequency (IF) in the band from 250 MHz to 750 MHz. After filtering, the still single-ended signal is input to a gainblock. The output of the gainblock goes to an analog-to-digital converter (ADC) after which the frequency shift of the channel and the combining is performed in the digital domain. The ADC operates on differential signals for reasons of improved signal-to-noise ratio. Consequently, a gainblock IC with differential outputs is an advantageous feature relative to current practice of using a gainblock with single-ended outputs with an external discrete balun making differential signals for the ADC.

A problem with known differential output stages is that they require a high driving signal and have insufficient linearity.

SUMMARY OF THE INVENTION

It is an object of the invention to provide a differential output stage having improved characteristics.

A differential output stage according to the invention comprises a first input for receiving a first input signal and a second input for receiving a second input signal. The first and second input signals together form a differential input signal. The differential output stage further comprises a first output for providing a first output signal, and a second output providing a second output signal. The first and second output signals together form a differential output signal. The differential output stage further comprises a first voltage buffer and a first controlled current source each connected to the first output. The first voltage buffer is driven by a signal in-phase with the first input signal. The first controlled current source being driven by a signal in-phase with the second input signal. The differential output stage further comprises a second voltage buffer and a second controlled current source each connected to the second output. The second voltage buffer is driven by a signal in-phase with the second input signal. The second controlled current source is driven by signal in-phase with by the first input signal.

The first output is connected to both a voltage buffer and to a controlled current source. The voltage buffer is driven by a signal which is in antiphase with the signal driving the controlled current source. As a result these two elements can compensate for each other thus giving better characteristics.

The output stage thus has an advantageous push-pull output stage topology with a cross-coupled connection from the stage driving the output stage to the differential push-pull output stage The differential output stage may for example be used in a so-called gainblock. In particular, it allows for gainblock ICs with advantageous specifications such as low-voltage (2.5V±10%) high-gain (~37 dB), high-linearity (~17 dBm OIP3) and good output matching (return loss >10 dB).

The differential (RF) output stage behaves as a voltage source with matched source impedance to the load. It is neither a perfect voltage source nor a perfect current source, but may be regarded as a load-impedance matched source.

In an embodiment, the first voltage buffer is connected to the first output through a first impedance and the second voltage buffer is connected to the second output through a second impedance. This impedance guarantees matching of the output to the load impedance (e.g. 50 Ohm).

The current going through the impedance may be reduced even though the output stage delivers the same gain. As the first input signal rises, the second input signal decreases, since they are from the same differential signal. The first voltage buffer transfers the first signal to its output in a buffered form; in particular its output increases if the first signal increases. In principle, an increase in voltage requires an increase in current through the load. This required load current is not delivered by the voltage buffer, but by the controlled current source. Since this yields an absence of current through the matching impedance, there is no associated gain loss. RF current going through the matching impedance would cause gain losses. The output stage can be used with reduced input signals, which in turn may be have better linearity and lower energy use.

The same holds in reverse if Vp decreases instead of increases. The same holds for the second impedance.

The invention thus overcomes gain loss due to output impedance matching. The invention has reduced common mode rejection or leakage due to amplitude/phase mismatch and is suitable for low(er)-voltage operation with uncompromised linearity.

By using a differential output stage as the final stage of an amplifier no costly balun is needed.

A voltage buffer amplifier is used to transfer a voltage from a first circuit, having a high output impedance level, to a second circuit with a low input impedance level The voltage from the first circuit is referred to the input or as driving the voltage buffer and the voltage on the second circuit as the output. A buffer amplifier prevents the second circuit from loading the first circuit unacceptably. A voltage buffer is sometimes also referred to as a voltage follower because the output voltage follows or tracks the input voltage.

The current through a controlled current source is determined by some other voltage, the other voltage being referred to as the input, or as driving the controlled current source.

In an embodiment, the signal in-phase with the first input signal driving the first voltage buffer is equal to the signal in-phase with the first input signal driving the second controlled current source and/or (preferably and) the signal in-phase with the second input signal driving the second voltage buffer is equal to the signal in-phase with the second input signal driving the first controlled current source.

In a straightforward implementation of low complexity, the first and/or second signal, possibly after filtering, is directly used for driving the voltage buffers and the controlled current sources.

In an embodiment, the signal in-phase with the first input signal driving the first voltage buffer has a higher amplitude than the signal in-phase with the first input signal driving the second controlled current source, and/or (preferably and) the signal in-phase with the second input signal driving the second voltage buffer has a higher amplitude than the signal in-phase with the second input signal driving the first controlled current source.

In an embodiment, the differential output stage comprises a first voltage divider configured for dividing the first input signal into the signal in-phase with the first input signal driving the first voltage buffer and into the signal in-phase with the first input signal driving the second controlled current source, and/or (preferably and) comprises a second voltage divider configured for dividing the second input signal into the signal in-phase with the second input signal driving the second voltage buffer and into the signal in-phase with the second input signal driving the first controlled current source.

A voltage divider is a particularly efficient way to divide a voltage signal such as the first and second signal. A voltage divider may comprise a first and a second resistor connected in series.

In an embodiment, the differential output stage comprises a high-pass filter connected to the first input and to the second input for filtering the first input signal and the second input signal.

Using a high-pass filter allows one to select a different operating point for the output stage. This is especially beneficial in low voltage applications.

In an embodiment, the first voltage buffer and the first controlled current source are configured such that there is equal gain from the input of the first voltage buffer to the output of the first voltage buffer which is connected to the first output, as from the input of the first controlled current source to the output of the first controlled current source which is connected to the first output, and/or (preferably and) the second voltage buffer and the second controlled current source are configured such that there is equal gain from the input of the second voltage buffer to the output of the second voltage buffer which is connected to the second output, as from the input of the second controlled current source to the output of the second controlled current source which is connected to the second output.

If there is equal gain from the input of the first voltage buffer to the output of the first voltage buffer which is connected to the first output, as from the input of the first controlled current source to the output of the first controlled current source which is connected to the first output, then there is no RF voltage difference over the matching impedance in case the first and second signals are equal. No RF voltage difference over the impedance implies that no RF current is flowing through the impedance and accordingly, no gain loss. The situation wherein the first and second signals are equal corresponds to an average situation and occurs often.

A single-ended input differential output stage comprising a differential output stage according to any one of the preceding claims, the single-ended input differential output stage comprising a converter for converting a single-ended input to a differential input signal for use at the first input and second input of the differential output stage.

In an embodiment, the converter comprises a first transistor configured to receive the single-ended input signal on its base and a second transistor configured to receive a bias voltage on its base, the first signal being produced on the collector of the first transistor and the second signal on the collector of the second transistor.

Another aspect of the invention concerns a differential amplifier comprising an output stage according to the invention. It is preferred that the stage driving the output stage is a single-to-differential converter. The differential amplifier could also be a fully differential amplifier A further aspect of the invention concerns a gain block IC comprising a differential amplifier and/or a differential output stage according to the invention.

A further aspect of the invention concerns a satellite receiver comprising a differential amplifier and/or a differential output stage and/or gain block IC according to the invention. The invention may be used in general RF applications, for example, using versatile 50Ω in/out broadband gainblock ICs like satellite receivers, but can be used for any differential RF output stage.

The differential output stage according to the invention may be included as the final stage of any device which for which it is advantageous to connect to a relatively low-ohmic (e.g. 50 Ohm) output and which should be able to deliver some power (e.g. 10 dBm=10 mW). For example, the differential output stage according to the invention may be included as the final stage of a buffer, mixer, active filter, oscillator, etc.

BRIEF DESCRIPTION OF THE DRAWINGS

The invention is explained in further detail by way of example and with reference to the accompanying drawings, wherein.

Throughout the Figures, similar or corresponding features are indicated by same reference numerals.

| List of Reference Numerals: | |
| --- | --- |
| 100 | differential amplifier |
| 110 | pre-stage |
| 121, 122 | transistor |
| 133 | first output |
| 137, 147 | resistor |
| 143 | second output |
| 151, 152 | current source |
| 160 | differential output stage 160 |
| 200 | a differential amplifier |
| 210 | a pre-stage |
| 220 | a high pass filter |
| 231, 241 | a connection to a voltage line |
| 232, 242 | a voltage buffer |
| 233 | a positive output |
| 243 | a negative output |
| 234, 244 | a controlled current source |
| 236, 246 | a DC bias block |
| 237, 247 | a resistor for impedance matching |
| 238, 248 | a DC bias block |
| 239, 249 | a connection to ground |
| 260 | a differential output-stage |
| 336, 346, 338, 348 | a resistor |
| 334, 344 | a transistor |
| 332, 342 | a transistor |
| 360 | a differential output-stage |
| 400 | a differential amplifier |
| 410 | a transistor |
| 420 | a transistor |
| 432, 434 | a resistor |

-continued

List of Reference Numerals:

| | |
|---|---|
| 442, 444 | a resistor |
| 450 | a current source |
| 470 | a single-to-differential converter |
| 436, 446 | a resistor |
| 532, 534, 542, 544 | a current source |

DETAILED EMBODIMENTS

While this invention is susceptible of embodiment in many different forms, there is shown in the drawings and will herein be described in detail one or more specific embodiments, with the understanding that the present disclosure is to be considered as exemplary of the principles of the invention and not intended to limit the invention to the specific embodiments shown and described.

Figure 1:
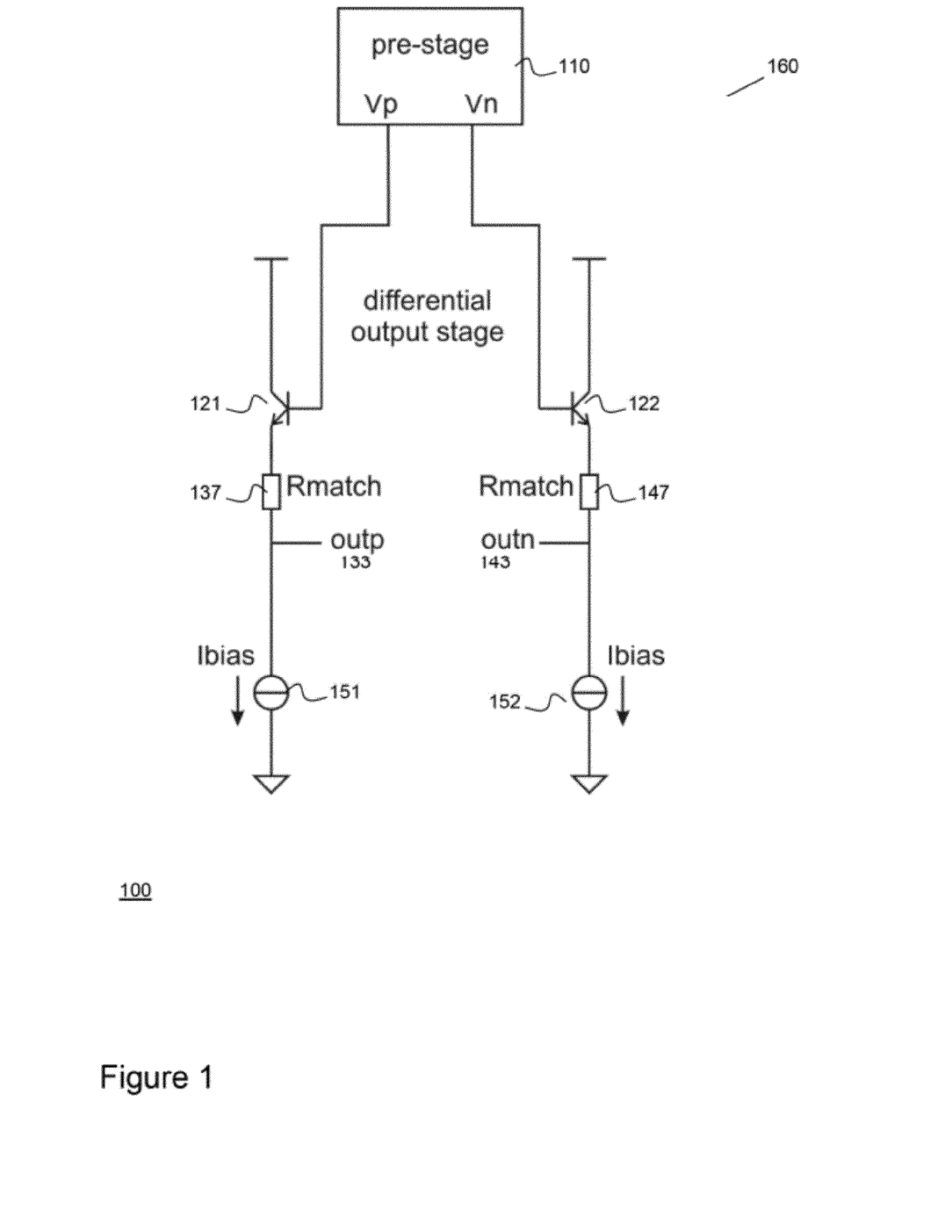
FIG. 1 is a block diagram schematically illustrating a differential output stage.

FIG. 1 shows as a schematic block diagram an amplifier 100 comprising a pre-stage 110 and a differential output stage 160. Differential output stage 160 is also referred to as a differential follower topology.

FIG. 1 shows a pre-stage 110, having differential outputs connected to differential output stage 160. The differential outputs of the pre-stage 110 are labeled Vp and Vn respectively. Vp and Vn are typically in antiphase, i.e., they have a phase difference of 180 degrees. The actual signal is represented by the difference Vp−Vn.

Amplification is provided by the pre-stage 110, but typically only in the voltage domain. Power corresponding to that amplification, is provided by the differential output-stage 160. The differential output-stage 160 receives Vp and Vn as input from pre-stage 110. The differential output-stage 160 comprises two emitter-follower type output-stages: one connected to Vp, one connected to Vn, respectively.

Output Vp of pre-stage 110 is connected to the base of a transistor 121. Transistor 121 may be of NPN type. The collector of transistor 121 is connected to a voltage line. The emitter of transistor 121 is connected to a resistor 137 for impedance matching. Resistor 137 is also referred to as Rmatch. The other end of resistor 137 is connected to one end of a current source 151. The other end of current source 151 is grounded.

Between resistor 137 and current source 151 an output 133 is provided for outputting the positive signal of the amplified signal.

Output Vn of pre-stage 110 is connected to the base of a transistor 122. The collector of transistor 122 is connected to a voltage line. The emitter of transistor 122 is connected to a resistor 147 for impedance matching. Resistor 147 is also referred to as Rmatch. The other end of resistor 147 is connected to one end of a current source 152. The other end of current source 152 is grounded.

Between resistor 147 and current source 152 an output 143 is provided for outputting the positive signal of the amplified signal.

Transistor 121 and Transistor 122 may be of NPN type. Resistors 137 and 147, referred to as 'Rmatch', are typically 50Ω. Transistor 121 and transistor 122 may be another type of transistor.

The differential output stage 160 has the disadvantage that in principle all the RF current will be flowing through the matching resistors Rmatch 137 and 147 resulting in voltage gain loss from input to output (6 dB when Rmatch=Rload). Given a certain required gain from input to output of the product (e.g. the 37 dB), this necessitates twice as large signals at the base of the emitter followers 121 and 122 compromising linearity in the preceding gain stage.

Simulation results support the two 6 dB gain loss in the branches of FIG. 1. Also an OIP3 loss has been observed. OIP3, also known as third-order intercept point is a measure for weakly nonlinear systems and devices such as linear amplifiers.

The disadvantages mentioned above are addressed in the embodiments of FIGS. 2, 3, 4, 5 and their variations.

Figure 2:
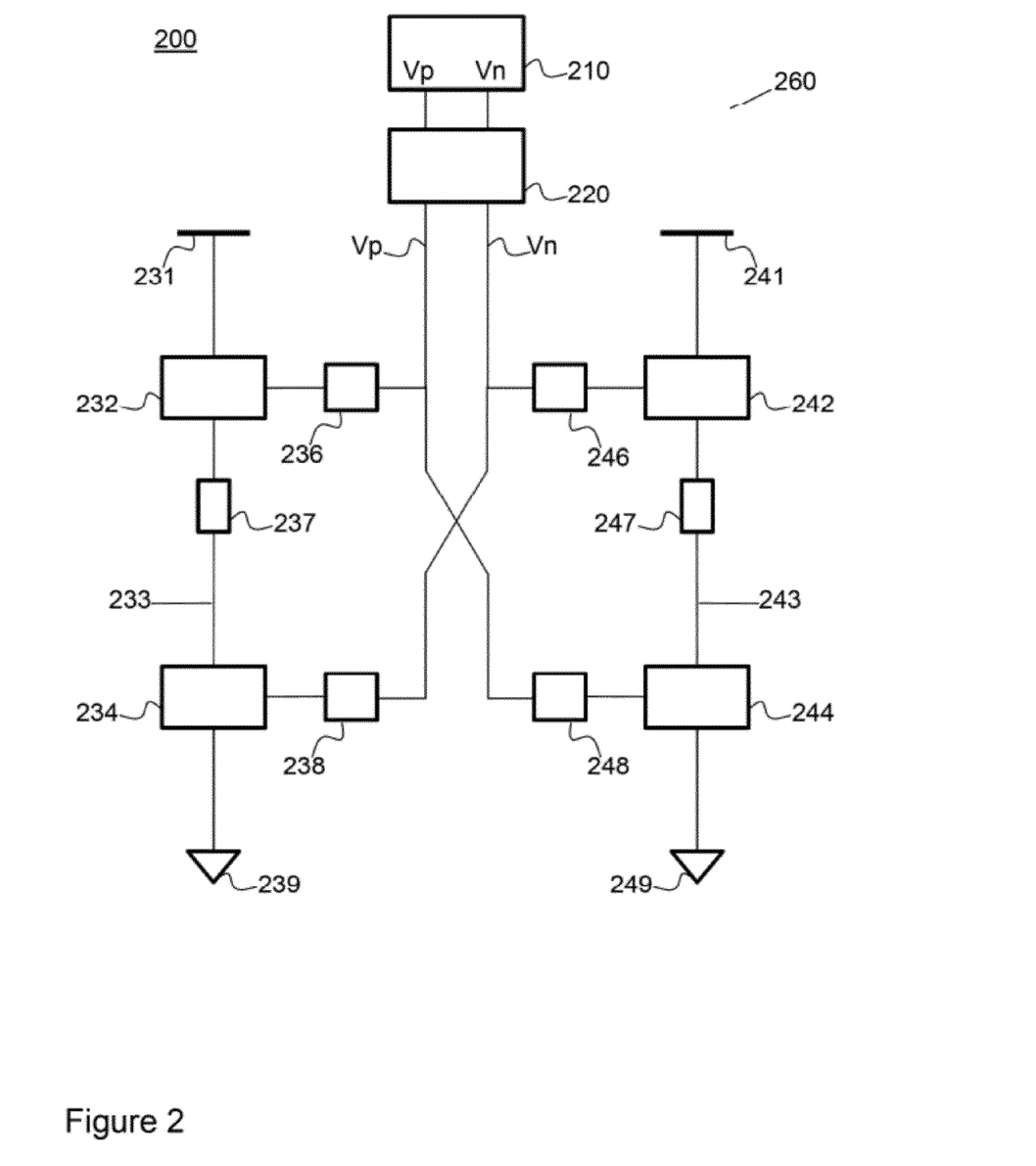
FIG. 2 is a block diagram schematically illustrating an improved differential output stage.

FIG. 2 shows as a schematic block diagram an amplifier 100 comprising a pre-stage 210 and a differential output stage 260. Differential output stage 260 is also referred to as a differential push-pull output stage with cross-coupling.

A differential output stage may be used as the final stage in an amplifier. The differential output stage may be regarded as a load-impedance matched source.

FIG. 2 shows a pre-stage 210, having differential outputs connected to differential output stage 260. The differential outputs of the pre-stage 210 are labeled Vp and Vn respectively. Vp and Vn are typically in antiphase, i.e., they have a phase difference of 180 degrees. The actual signal is represented by the difference Vp−Vn.

Pre-stage 210 provides differential input signals to differential output stage 260. For example, pre-stage 210 may provide amplification in the voltage domain. Pre-stage 210 may provide the differential inputs by converting from a single input to differential signals, e.g., by use of a balun. Power corresponding to that voltage signal, is provided by the differential output-stage 260.

Differential amplifier 200 comprises a pre-stage 210 and a differential output stage 260. Differential output stage 260 comprises a first input and a second input (not separately labeled in FIG. 2). If output stage 260 comprises a high pass filter 220, the first and second input may be provided on high pass filter 220 to receive the output signals of pre-stage 210. If differential output-stage 260 does not have a high pass filter 220 the first and second input may be provided at the point where differential output-stage 260 receives the input signals from pre-stage 210.

The differential output-stage 260 receives Vp and Vn as input from pre-stage 210. The signal Vp that differential output-stage 260 receives is interchangeably referred to as the first input signal, and signal Vn as the second input signal. Vp and Vn are the two components of a differential input signal. differential output-stage 260 is particular well suited for amplification of differential radio frequency input signals, due to the high frequency. In particular, the differential stage according to the invention is suited for frequencies in the range 250 to 750 MHz. Alternatively, the output stage could be used for amplification of other types of signals, e.g., of an electronic signal representing audio.

The differential output-stage 260 comprises two branches one for Vp and one for Vn.

In general, the differential output stage may comprise a first branch for producing the first output signal, the first branch comprising a first voltage buffer and a first controlled current source each connected to the first output; and a second branch for producing the second output signal, the second branch comprising a second voltage buffer and a second controlled current source each connected to the second output.

The first branch is also referred to as the positive branch. The second branch is also referred to as the negative branch. The branches are also referred to as output branches.

An important difference with the design of FIG. 1 is that the two branches of FIG. 2 are cross-coupled. Each branch receives both the first and the second input signal, but not in the same order.

Differential output-stage 260 may optionally comprise a high-pass filter 220 for filtering the incoming inputs Vp and Vn. For example, high-pass filter 220 may use AC coupling. For example, each one of Vp and Vn coming from pre-stage 210 may be filtered by leading the signal through a capacitor. Outputs of high-pass filter 220 are also labeled Vp and Vn. Using a high-pass filter, in particular through AC coupling allows a different DC point to be chosen in differential output stage 260.

The positive branch of differential output stage 260 comprises a voltage buffer 232 driven by Vp and a controlled current source 234 driven by Vn. At the other side, the negative branch of differential output stage 260 comprises a voltage buffer 242 driven by Vn and a controlled current source 244 driven by Vp. The voltage buffer and the current source in one branch are connected through a resistor for impedance matching. The output signal is obtained between the matching resistor and the controlled current source. As a result of the cross coupling, no gain loss, or at least significantly reduced gain loss, occurs in the resistor. Accordingly, less gain is required elsewhere, such as in pre-stage 210. Less gain is more energy efficient, and also allows better linearity.

Voltage buffer 232 is also referred to as the first voltage buffer. Voltage buffer 242 is also referred to as the second voltage buffer. Controlled current source 234 is also referred to as the first controlled current source. Controlled current source 244 is also referred to as the second controlled current source.

FIG. 2 shows one way to connect the first and second voltage buffers and the first and second controlled current sources.

Output Vp of high-pass filter 220 is connected to an input of voltage buffer 232. Voltage buffer 232 is connected to a voltage line at connection 231. An output of voltage buffer 232 is connected to a resistor 237 for impedance matching. Resistor 237 is also referred to as Rmatch.

The other end of resistor 237 is connected to one end of a controlled current source 234. The other end of controlled current source 234 is grounded at 239. An output 233 (outp) is provided between resistor 237 and controlled current source 234. Output 233 is also referred to as the first output.

Output Vn of high-pass filter 220 is connected to an input of voltage buffer 242. Voltage buffer 242 is connected to a voltage line at connection 241. An output of voltage buffer 242 is connected to a resistor 247 for impedance matching. Resistor 247 is also referred to as Rmatch. Typically resistor 247 has the same value as resistor 237.

The other end of resistor 247 is connected to one end of a controlled current source 244. The other end of controlled current source 244 is grounded at 249. An output 243 (outn) is provided between resistor 247 and controlled current source 244. Output 243 is also referred to as the second output.

The first output provides a first output signal to a subsequent device using signal amplified by amplifier 200. The second output providing a second output signal to the subsequent device. For example the subsequent device could be a differential analog-to-digital converter (ADC). Together, the first and second output signals form a differential output signal.

Preferably, a gainblock comprising the differential output stage does not use external output coils, which would limit the available output stage topologies.

Voltage buffers 232 and 242 are preferably of emitter following type. For example, voltage buffer 232 and/or 242 may comprise a transistor, such as an NPN transistor. In that case, outputs Vp and Vn of high-pass filter 220 or outputs Vp and Vn of pre-stage 210 may be connected to the base of those transistors, respectively.

The outputs Vp and Vn of high-pass filter 220 are preferably connected to voltage buffers 232 and 242, respectively, through DC bias blocks 236 and 246 respectively. The DC bias blocks 236 and 246 raise the average voltage by a pre-determined amount. Especially, if high-pass filter 220 is implemented as AC coupling, the use of DC blocks is advantageous.

The outputs Vp and Vn of high-pass filter 220 are preferably connected to controlled current sources 234 and 244, respectively, through DC bias blocks 238 and 248 respectively. The DC bias blocks 238 and 248 raise the average voltage by a pre-determined amount.

High-pass filter 220 may be omitted, in which case output Vp of pre-stage 210 is connected directly to controlled current source 232 and controlled current source 244, possibly via DC bias blocks 236 and 248; and output Vn of pre-stage 210 is connected directly to controlled current source 242 and controlled current source 234, possibly via DC bias blocks 246 and 238.

The value of resistor 237 and resistor 247 depend on the desired impedance matching, and are typically 50Ω. Typically, Rmatch equals an Rload. The differential output stage may be configured with a matched input and output and with a return loss better than 10 dB, in particular with both at 50Ω.

In FIG. 2, the first voltage buffer is connected to the first output through resistor 237, which is an example of a first impedance. The second voltage buffer is connected to the second output through resistor 247, which is an example of a second impedance.

Other types of impedances than resistors are known.

The required anti-phase input signals per output branch are obtained by cross-coupling the output signals from the preceding stage. This preceding stage 210 could be a single-to-differential converter or a differential amplifier.

During operational use, differential output stage 200 reduces the current going through the impedance 237 even though the output stage delivers the same gain. As the first input signal Vp rises, the second input signal Vn decreases, since they are from the same differential signal. First voltage buffer 232 transfers the first signal to its output in a buffered form; in particular its output increases if the first signal Vp increases. In principle, an increase in voltage requires an increase in current through the load. This required load current is not delivered by the voltage buffer 232, but by the controlled current source 234. Since this yields an absence of current through the matching impedance, there is no associated gain loss.

The additional current on output 233, as a result of the increase of Vp will only partially go through resistor 237. Thus more amplification is realized for the same amount of DC bias current. The same holds in reverse if Vp decreases instead of increases.

Similarly, at the other side, increased current caused by a voltage increase on the output of voltage buffer 242 is picked up by controlled current source 244, avoiding losses at impedance 247.

Dimensioning of the output stage 260 is preferably done such that the controlled power sources 234 and 244 deliver all the current and consequently there will be no RF current flowing through Rmatch (237 and 247) therefore there will be no voltage gain loss from input to output. Dimensioning the output stage at this sweet spot, wherein there is equal gain from the input of voltage buffer 232 and 242 to the output as from the input of the controlled current source 234 and 244 to the output when the RF signals are equal has the additional advantage that amplitude and phase mismatch at the output of the stage driving the differential push-pull output stage are reduced resulting in better common-mode rejection or common-mode leakage when the preceding stage is a single-to-differential converter. This situation occurs there is no attenuation in the path to the low-side relative to the path to the high-side. So, the condition is when Vp/Vn is put both on 232/242 as well as 234/244.

The voltage headroom and linearity is not compromised, as would be the case, in for example a white follower derived output stage. In a white follower derived output stage a resistor is used in the collector lead of the high-side transistor to make an anti-phase signal.

Loading of the controlled current sources 234 and 244 on the driving stage may compromise bandwidth. This can be mitigated by using a smaller RF signal for the controlled current sources 234 and 244 compared to the voltage buffers 232 and 242 Smaller signals for the controlled current sources are also beneficial for linearity.

Amplifier and buffer topologies are preferred based on NPNs. The same holds for the other output stages described below.

Figure 3:
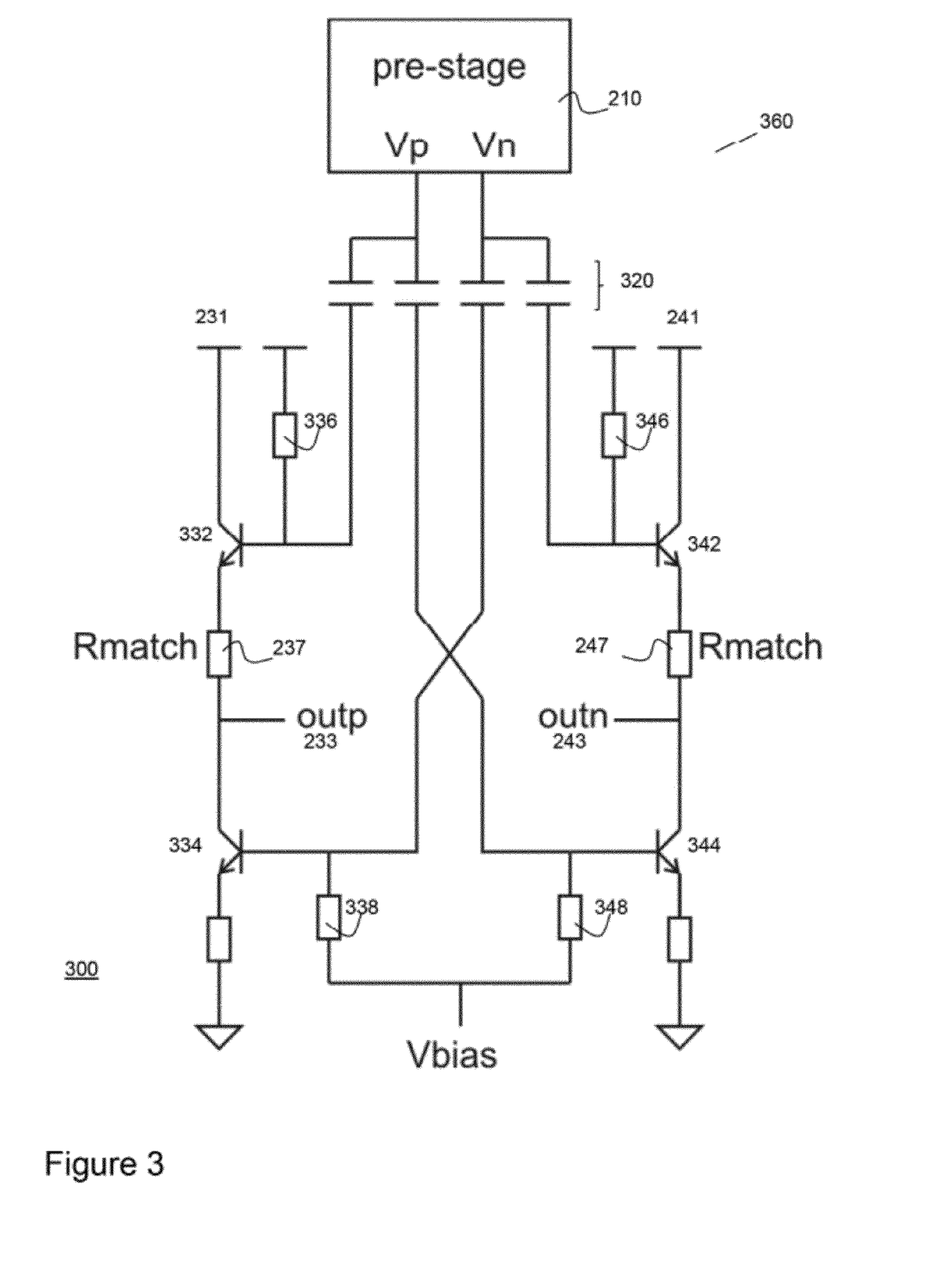
FIG. 3 is a block diagram schematically illustrating a first embodiment.

FIG. 3 shows as a schematic block diagram an amplifier 300 comprising a pre-stage 210 and a differential output stage 260. Differential output stage 260 is also referred to as a differential push-pull output stage with cross-coupling. FIG. 3 is a refinement of FIG. 2.

FIG. 3 shows a pre-stage 210. Optional high-pass filter 220 has been implemented as an AC coupling 320. Differential outputs of pre-stage 210 are connected to the optional high pass filter 320 of AC coupling type. Note that compared to FIG. 2, the filtering has been split not only per side, as shown in FIG. 2, but also for the voltage buffer and controlled current blocks. This allows finer control over the filtering, but is not necessary.

DC bias blocks 236, 246, 238 and 248 are implemented as connections with a voltage line through resistors 336, 346, 338 and 348 respectively. Voltage buffer 232 and voltage buffer 242 are implemented as a transistor, in this case transistors 332 and 342 respectively. The controlled current sources are implemented as a transistor of which the emitter is connected to ground via a resistor. Controlled current source 234 is implemented as transistor 334 and a resistor. Controlled current source 244 is implemented as transistor 344 and a resistor. Transistor 332 and 342 are also referred to as the high-side transistors. Transistors 334 and 344 are also referred to as low-side transistors.

Transistors 332, 342, 334 and 344 may all be of NPN type.

For the positive branch, output Vp of pre-stage 210 is connected through a capacitor with the base of transistor 332. Collector of transistor 332 is connected to a voltage line at 231. Base of transistor 332 is also connected to a voltage line through resistor 336 for biasing. Emitter of transistor 332 is connected to resistor 237. Resistor 237 is connected to the collector of transistor 334. The emitter of transistor 334 is connected to ground through a resistor. Output Vn of pre-stage 210 is connected through a capacitor with the base of transistor 334. Base of transistor 334 is also connected to a voltage line, labeled Vbias, through a resistor 338. Output 233 (outp) is provided at the connection between resistor 237 and the collector of transistor 334.

The negative branch of differential output-stage 360 the same as the positive branch except with positive and negative interchanged.

Dimensioning of the output stage 360 may be done such that there is equal gain from the base of the high-side NPN to the output as from the base of the low-side NPN to the output when the RF signals are equal, as is the case in FIG. 3. In this case, no gain loss occurs over resistor 237 and resistor 247.

Figure 4:
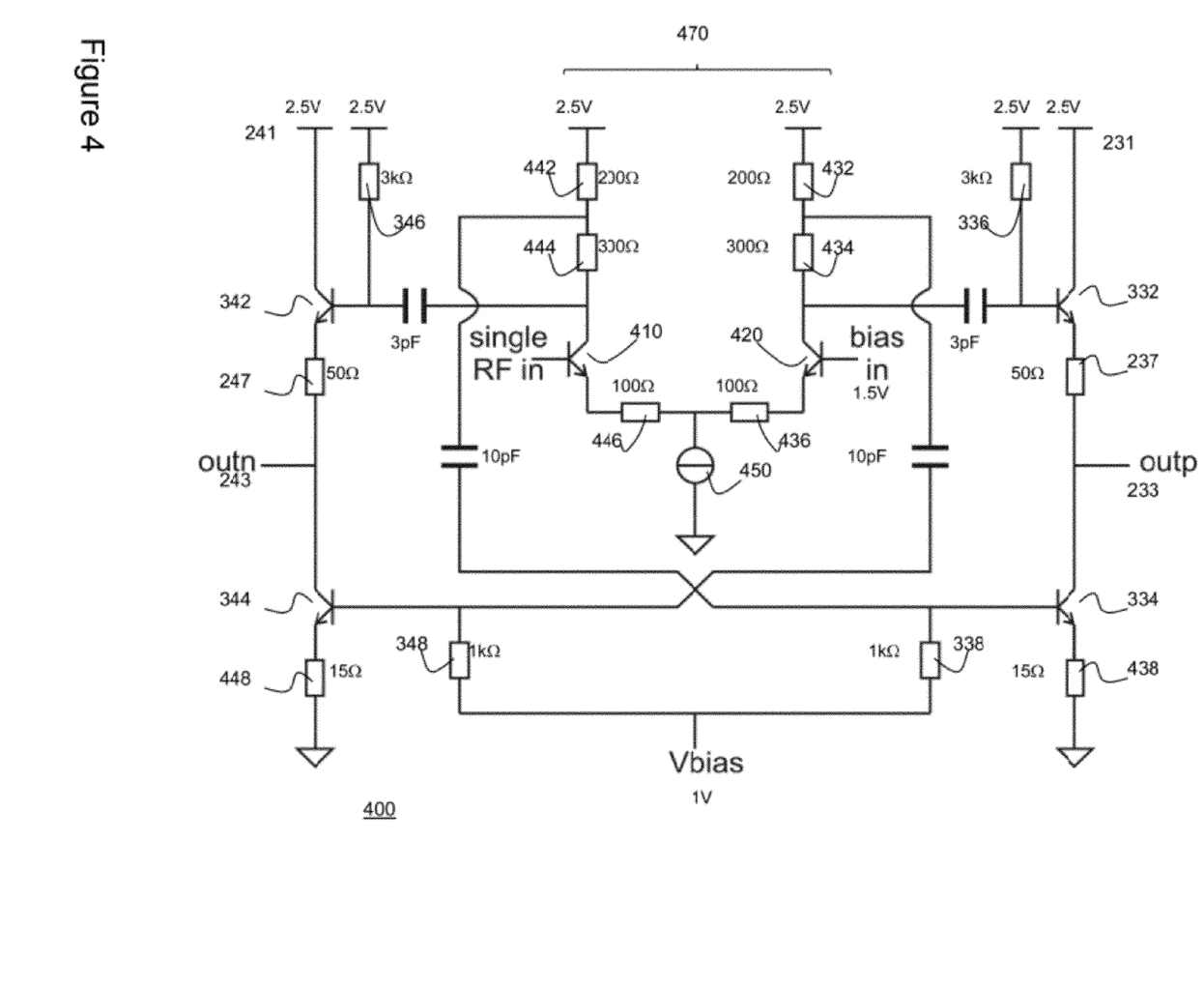
FIG. 4 is a block diagram schematically illustrating a second embodiment.

FIG. 4 illustrates an embodiment 400 with a single-to-differential converter implemented as a differential pair. FIG. 4 has been marked with exemplary dimensions. The dimensions shown in FIG. 4 are only meant to further illustrate the invention and not to limit the invention. Other values may be chosen than those shown in FIG. 4

FIG. 4 is similar to the FIG. 3 embodiment, but illustrates two new advantageous features.

First, a converter to convert from a single-ended input to a differential signal is integrated. The converter shown in FIG. 4 is particularly effective with the design of FIG. 3. This arrangement does not need costly balun to convert from single-ended to differential signals.

By having differential outputs and a single-ended input a bulky and expensive balun may be omitted. A Balun is often used for generating differential signals in applications.

Second, FIG. 4 illustrates that it may be advantageous to drive the voltage buffer and the controlled current source (e.g., controlled current source 232 and controlled current source 244, or controlled current source 242 and controlled current source 234) at different amplitudes, but at the same phase. The two different signals may be produced in a single-to differential converter. They may also be produced by other means, e.g., a dedicated voltage divider to split a single differential signal into two differential signals having different amplitudes.

Amplifier 400 comprises a single-to-differential converter 470 for converting a single-ended input signal to a differential-input signal for use in an output stage, e.g., output stage 260 or 360. Converter 470 may take the place of pre-stage 210, but convertor 470 may also be preceded by another pre-stage, such as for amplification in the voltage domain. The single-to-differential converter 470 is here implemented as a differential pair.

Convertor 470 comprises a transistor 410 and a transistor 420. Transistor 410 is configured to receive the single-ended input RF signal on its base. Transistor 420 is configured to receive a bias voltage on its base. The emitter of transistor 410 and transistor 420 are both connected to a current source 450. The other side of current source 450 is grounded. The collector of transistor 410 and the collector of transistor 420 are connected to a voltage line. This configuration produces a Vp (first signal) on the collector of transistor 410 and a Vn (second signal) on the collector of the second transistor 420.

The collector of transistor 410 is optionally connected to the voltage line through a voltage divider. The voltage divider is formed by resistors 442 and 444. The voltage divider provides one output for signal Vn, in FIG. 4 between resistors 442 and 444. Another output for Vn is provided between the voltage divider and the collector of transistor 410, i.e. between resistor 444 and the collector of transistor 410.

Optionally, transistor 410 is connected to current source 450 through a resistor 446. Optionally, transistor 420 is connected to current source 450 through a resistor 436.

When a voltage divider is used the two outputs of Vn do not have the same amplitudes, they do keep the same phase. The voltage divider may be omitted, e.g., resistor 444 may be removed and connected through. Also both resistors 442 may be omitted (or both), however there should be at least be some impedance between collector and the voltage line otherwise there is no signal anymore.

Similarly, the collector of transistor 420 may be connected to the voltage line through a voltage divider; here formed by resistors 432 and 434. As above, two outputs for Vp are created.

In this embodiment, the first voltage buffer 232, here transistor 342, is driven by a signal in-phase with the first input signal Vp, while the first controlled current source is driven by a signal in-phase with the second input signal Vn. These two driving signals are in anti-phase and may or may not have the same amplitude. In FIG. 4 the amplitudes of the driving signals are different.

Loading of the low-side NPNs (344 and 334) on the driving stage may compromise bandwidth. This is mitigated in the embodiment of FIG. 4 by using a smaller RF signal for the low-side NPN compared to the high-side NPN e.g. by using a tap of the output resistor of the driving stage, which in turn forms a voltage divider. It turns out that these smaller signals for the low-side NPN are also beneficial for linearity.

The two Vp signals have the same phase but different amplitude. Driving transistor 344 and transistor 334 with a smaller signal is compensated by using a higher amplification factor. This may be accomplished for example by reducing the resistance of a resistor between the emitter and ground. In FIG. 4, resistors 438 and 448 have a smaller value compared to the same resistors in FIG. 3. For example, when the resistors in FIG. 3 are 50 Ohm, then with an attenuation of the amplitudes on 344/334 with a factor 2, the resistors 448/438 will be 25 Ohm in FIG. 4.

Compensating a smaller driving signal with higher amplification increases the linearity. In FIG. 4 (and FIG. 3) AC coupling is used for the connection of the base of the high-side NPNs. This is particularly beneficial in low-voltage applications since the base is now driven close to VCC. AC coupling is optional however, for example in FIG. 4, the high-side bases can also be connected directly to the output of the preceding stage.

Figure 5:
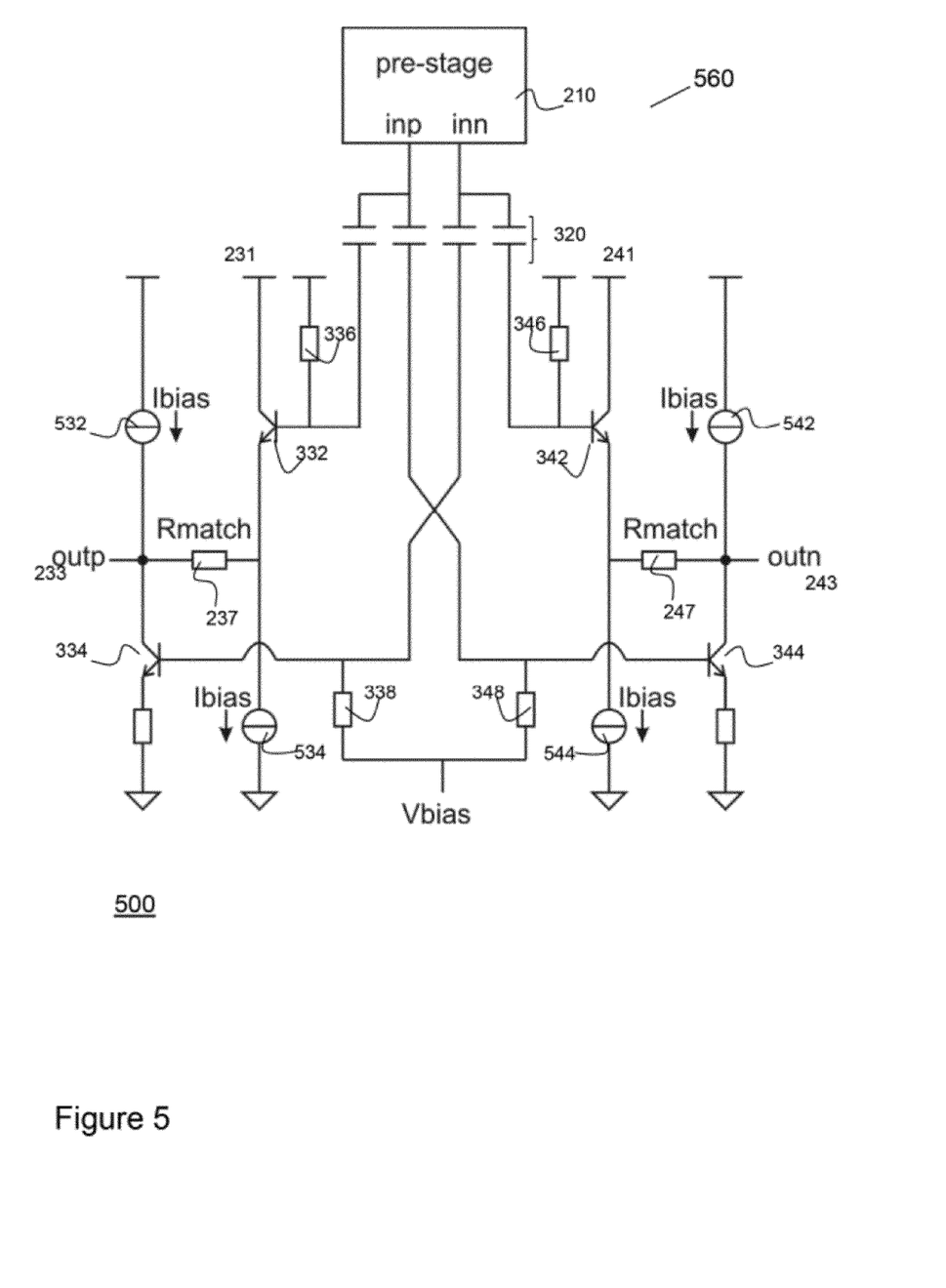
FIG. 5 is a block diagram schematically illustrating a third embodiment.

FIG. 5 shows an additional embodiment 500 which has especially benefits in low-voltage applications.

The embodiment shown in FIG. 5 is another refinement of the FIG. 3 embodiment.

In general, current sources are connected to each end of matching resistors 237 and 247.

In Output stage 560 shown in FIG. 5, this is implemented as follows: A current source 532 is connected to resistor 237 between one end of resistor 237 and the collector of transistor 334, i.e., the same region where outp attaches. A current source 534 is connected to resistor 237 between the other end of resistor 237 and the emitter of transistor 332. Current sources 532 and 534 are typically connected to supply and ground respectively.

A current source 542 is connected to resistor 247 between one end of resistor 247 and the collector of transistor 344, i.e., the same region where outn attaches. A current source 544 is connected to resistor 247 between the other end of resistor 247 and the emitter of transistor 342. Current sources 542 and 544 are also connected to supply and ground.

Optionally, any one of one of current sources 532 and 534 may be omitted. For example, omitting current source 534 having only current source 532 to subtract some DC current from controlled current source 334 when the controlled current source is driven deeply in class A for best linearity performance. In this case having only current source 532 allows 334 to have more DC bias current. Basically 532 and 534 decouple the DC bias current settings of transistor 334 and transistor 332 respectively such that they can be chosen independently. In an embodiment, both current source 534 and current source 544 are omitted from FIG. 5.

In the embodiments of FIGS. 2, 3, 4 and 5 the AC current going through Rmatch is removed, or at least reduced (compared to the prior art); this prevents gain loss. In the embodiment of FIG. 5 also the DC current going through Rmatch is removed, or at least reduced; in particular if the DC current of 532 (=Ibias) equals the DC current through controlled current source 334. This gives controlled current source 234, and controlled current source 244, e.g. the low-side NPN more voltage headroom to operate more linearly.

Note that the extra high-side DC current source at the output node can also be dimensioned to be different from the quiescent value of the low-side NPN driving current source (it can also be larger) to accommodate any optimal DC voltage at the output (e.g. VCC/2) to be different from the output of the emitter follower. Note that the wideband impedance seen from the output looking into the output stage is still Rmatch. Furthermore (also true for FIGS. 2, 3 and 4) the cross-coupling is isolated from the output by the emitter followers, thereby avoiding (or at least strongly reducing) detrimental effects of negative impedances seen from the output nodes.

The embodiment of FIG. 5 may be integrated with a single-ended to differential converter such as convertor 470. Also FIG. 5 may use signals of different amplitudes to drive the voltage buffer and controlled current sources.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention claimed is:

1. A differential output stage, comprising
a first input for receiving a first input signal and a second input for receiving a second input signal, the first and second input signals together forming a differential input signal,
a first output for providing a first output signal, and a second output providing a second output signal, the first and second output signals together forming a differential output signal,
a first voltage buffer and a first controlled current source each connected to the first output, the first voltage buffer being driven by a signal in-phase with the first input signal, the first controlled current source being driven by a signal in-phase with the second input signal, and
a second voltage buffer and a second controlled current source each connected to the second output, the second voltage buffer being driven by a signal in-phase with the second input signal, the second controlled current source being driven a signal in-phase with by the first input signal.

2. A differential output stage as in claim 1, wherein the first voltage buffer is connected to the first output through a first impedance and the second voltage buffer is connected to the second output through a second impedance.

3. A differential output stage as in claim 2, wherein
a current source is connected to one end of the first impedance, and/or
a current source is connected to one end of the second impedance.

4. A differential output stage as in claim 2, wherein
a further current source is connected to the other end of the first impedance, and/or
a further current source is connected to the other end of the second impedance.

5. A differential output stage as in claim 1, wherein
the signal in-phase with the first input signal driving the first voltage buffer has a higher amplitude than the signal in-phase with the first input signal driving the second controlled current source,
and/or
the signal in-phase with the second input signal driving the second voltage buffer has a higher amplitude than the signal in-phase with the second input signal driving the first controlled current source.

6. A differential output stage as in claim 5 which,
comprises a first voltage divider configured for dividing the first input signal into the signal in-phase with the first input signal driving the first voltage buffer and into the signal in-phase with the first input signal driving the second controlled current source, and/or
comprises a second voltage divider configured for dividing the second input signal into the signal in-phase with the second input signal driving the second voltage buffer and into the signal in-phase with the second input signal driving the first controlled current source.

7. A differential output stage as in claim 1, comprising a high-pass filter connected to the first input and to the second input for filtering the first input signal and the second input signal.

8. A differential output stage as in claim 1, wherein
the first voltage buffer and the first controlled current source are configured such that there is equal gain from the input of the first voltage buffer to the output of the first voltage buffer which is connected to the first output, as from the input of the first controlled current source to the output of the first controlled current source which is connected to the first output,
and/or
the second voltage buffer and the second controlled current source are configured such that there is equal gain from the input of the second voltage buffer to the output of the second voltage buffer which is connected to the second output, as from the input of the second controlled current source to the output of the second controlled current source which is connected to the second output.

9. A differential output stage as in claim 1, wherein the first voltage buffer and/or the second voltage buffer comprises a transistor, the base of the transistor receiving the signal in-phase with the first or second input signal driving the first or second voltage buffer, the emitter of the transistor being connected to the first or second output, respectively.

10. A differential output stage as in claim 1, wherein the first controlled current source and/or the second controlled current source comprises a transistor (334, 344), the base of the transistor receiving the signal in-phase with the second or first input signal driving the first or second controlled current source, the collector of the transistor being connected to the first or second output, respectively.

11. A differential output stage as in claim 10, wherein the emitter of the transistor of the controlled current source is connected to ground via a resistor.

12. A differential output stage as in claim 1, wherein the differential input signal and the differential output signal are radio frequency signals.

13. A single-ended input differential output stage comprising a differential output stage according to claim 1, the single-ended input differential output stage comprising a converter for converting a single-ended input to a differential input signal for use at the first input and second input of the differential output stage.

14. A single-ended input differential output stage as in claim 13, wherein the converter comprises a first transistor configured to receive the single-ended input signal on its base and a second transistor configured to receive a bias voltage on its base, the first signal being produced on the collector of the first transistor and the second signal on the collector of the second transistor.

15. Differential amplifier comprising an output stage as in claim 1.

16. Satellite receiver comprising a differential amplifier as in claim 15.

* * * * *